United States Patent
Lueckehe

[11] Patent Number: 5,897,707
[45] Date of Patent: Apr. 27, 1999

[54] APPARATUS FOR APPLYING SOLDER PASTE TO CONTACT ELEMENTS OF BALL GRID ARRAY COMPONENTS

[75] Inventor: Hans-Werner Lueckehe, Salzkotten, Germany

[73] Assignee: Siemens Aktiengesellschaft, Munich, Germany

[21] Appl. No.: 08/935,772

[22] Filed: Sep. 23, 1997

[30] Foreign Application Priority Data

Sep. 30, 1996 [DE] Germany ............................ 196 40 285

[51] Int. Cl.[6] ...................................................... B05C 1/00
[52] U.S. Cl. ........................ 118/213; 118/406; 118/500; 118/504; 118/505; 228/248.1; 228/254; 228/49.5; 228/41
[58] Field of Search ..................................... 118/213, 301, 118/406, 500, 504, 505; 101/126, 127; 427/96, 282; 228/248.1, 254, 49.5, 41

[56] References Cited

U.S. PATENT DOCUMENTS

| | | | |
|---|---|---|---|
| 5,332,439 | 7/1994 | Watanabe et al. | 118/213 |
| 5,392,980 | 2/1995 | Swamy et al. | 228/119 |
| 5,395,040 | 3/1995 | Holzmann | 118/213 |
| 5,522,929 | 6/1996 | Erdmann | 118/213 |
| 5,540,779 | 7/1996 | Andris et al. | 427/96 |
| 5,693,559 | 12/1997 | Taniguchi et al. | 118/213 |

FOREIGN PATENT DOCUMENTS 0267359  5/1988  European Pat. Off. .............. 101/127

*Primary Examiner*—Laura Edwards
*Attorney, Agent, or Firm*—Hill & Simpson

[57] ABSTRACT

An apparatus is provided for applying solder paste to the contact elements of ball grid array components, which is economical to manufacture and simple to handle, and which nonetheless offers the possibility of being able to apply a desired amount of solder precisely to the contact elements of a ball grid array component. The apparatus includes a rack on which a printing screen and an adjusting screen, each with a hole pattern corresponding to the pattern of the contact elements, are arranged one over the other in such a way that their hole patterns are aligned with one another, whereby the hole diameter or mesh size of the adjusting screen is greater than the diameter of the contact elements, a component mount intended for the mounting of the component, which mount is mounted on the rack, perpendicular to the screens, so as to be movable between a print position, in which the component lies at least approximately on the adjusting screen with contact elements that engage in the adjusting holes thereof, and a component exchange position, and has a mechanism for holding the component fast, and a doctor blade apparatus with a doctor blade that lies on the side of the printing screen turned away from the component and can be positioned parallel to this screen.

20 Claims, 2 Drawing Sheets

APPARATUS FOR APPLYING SOLDER PASTE TO CONTACT ELEMENTS OF BALL GRID ARRAY COMPONENTS

FIELD OF THE INVENTION

The present invention relates to an apparatus for applying solder paste to the spherical contact elements of ball grid array components.

The soldering of ball grid array components requires a small volume of solder paste per contact element with very precise and defined application of solder paste to the contact points.

For this purpose, up to now, in order to achieve a solder application with a point size of less than 0.2 mm diameter and a volume of less than 0.08 mm$^3$, automatic dosage machines have been incorporated with very precise coordinate systems, image comparison systems for optical aid in orientation, and special dosage heads. The cost of acquisition of such automatic dosage machines currently exceeds DM 200,000.

In order to be able to achieve the dosage result with automatic dosage machines, fine-pitch soldering pastes must be used, which are specially designed and are offered by only a few manufacturers.

For these reasons, compromises must often be accepted between the quality of the soldered connections and processibility.

Another comparable solder paste application method is silk printing or screen printing, whereby here highly precise automatic print machines with optical orientation assistance and a very precise coordinate system are used. The cost of acquisition of such an automatic printing machine is more than DM 80,000.

Accordingly, there is a need for an apparatus of the type named above that is economical to manufacture and easy to handle, and which nonetheless offers the possibility of precise application of a desired quantity of solder to the contact elements of a ball grid array component.

SUMMARY OF THE INVENTION

In satisfaction of this need, the inventive apparatus comprises a rack on which a printing screen and an adjusting screen, each with a hole pattern corresponding to the pattern of the contact elements, are arranged one over the other in such a way that their hole patterns are aligned with one another, whereby the hole diameter of the adjusting screen is greater than the diameter of the contact elements, a component mount intended for the mounting of the component, which mount is mounted on the rack, perpendicular to the screens, so as to be movable between a print position, in which the component lies at least approximately on the adjusting screen with contact elements that engage in the adjusting holes thereof, and a component exchange position, and has means for holding the component fast, and a doctor blade apparatus with a doctor blade that lies on the opposite side of the printing screen from the component and can be positioned parallel to the printing screen.

The holes of the printing screen are dimensioned with respect to diameter and axial length in such a way that the desired amount of solder is applied to the contact elements. The adjusting screen lies fixedly opposite the printing screen. If the component is laid on the adjusting screen in such a way that its contact elements engage in the holes of the adjusting screen, the component is thereby also automatically oriented exactly opposite the printing screen. This requires neither optical orientation aids nor precise coordinate systems for a positioning of the printing screens relative to the component. After laying the component on the adjusting screen, it is sufficient to position the component mount in the direction toward the screens and to fasten the component mount in a position oriented opposite the printing screen. Subsequently, solder paste is applied to the printing screen and is spread into the screen holes of the printing screen with the doctor blade. By moving the component mount into its component exchange position, the component is then removed exactly perpendicularly from the screens, so that the applied solder paste cannot smear. In this way, a highly precise, defined solder application result is obtained with an apparatus that is more economical, by several orders of magnitude, than the previously known automatic dosage machines.

The attachment of the component to the component bearer can, for example, be attained by means of a double-sided adhesive strip.

In a preferred embodiment, the rack comprises a base plate and a plurality of supports fastened thereto, which bear the screens at their ends further from the base plate, and on which the component bearer is carried. Preferably, the screens are fastened exchangeably to the rack, so that, by means of different constructions of the printing screens, the amount of solder paste to be applied can be dosed exactly according to need.

The component mount can be formed from a plate that is oriented parallel to the screens and that can be moved in the direction toward the screens, for example by means of an eccentric mechanism against the pressure of a spring.

In order to enable uniform spreading of the solder paste on the printing screen, it is useful for the doctor blade to be coupled with a drive mechanism.

In an embodiment, the present invention provides an apparatus for applying solder paste to spherical contact elements that have a uniform first diameter. The apparatus comprises a printing screen that overlies an adjusting screen. Both the printing screen and the adjusting screen comprise a plurality of holes that are in matching registry. The holes or mesh sides of the printing screen are smaller than the diameter of the spherical contact elements. The holes or mesh sides bf the adjusting screen are larger than the spherical contact elements so that the spherical contact elements may be accommodated inside the holes of the adjusting screen but must be disposed below the holes of the printing screen because the holes of the printing screen are not large enough to accommodate the spherical contact elements. Thus, the adjusting screen holds the spherical contact elements in place below the holes of the printing screen and solder paste may be accurately pushed through the holes of the printing screen and applied to the top portions of the spherical contact elements.

In an embodiment, the screens are suspended across an open area of a cover plate and the spherical contact elements, which comprise part of a component, are mounted to a movable component mount which may be provided in the form of a plate or other structure that can move towards or away from the cover plate. The component mount is movable between a printing position whereby the spherical contact elements are disposed within the holes of the adjusting screen and a component exchange position whereby the spherical contact elements are disposed below and free of the adjusting screen so that the component may be removed from the component mount and exchanged with another component to which solder paste is to be applied.

In an embodiment, the component mount is spring biased away from the screens towards the component exchange position and a positioning element pushes the component mount upwards against the bias of the springs and towards the springs when activated. In a preferred embodiment, the positioning element includes a means for holding the component mount and spherical contact elements in the print position.

Other objects and advantages of the present invention will become apparent upon reading the following detailed description and appended claims, and upon reference to the accompanying drawing.

BRIEF DESCRIPTION OF THE DRAWING

For a more complete understanding of the invention, reference should now be made to the embodiment illustrated in greater detail in the accompanying drawing and described below by way of an example of the invention.

It should be understood that the drawings are not necessarily to scale and that the embodiments are sometimes illustrated by graphic symbols, phantom lines, diagrammatic representations and fragmentary views. In certain instances, details which are not necessary for an understanding of the present invention or which render other details difficult to perceive may have been omitted. It should be understood, of course, that the invention is not necessarily limited to the particular embodiments illustrated herein.

DETAILED DESCRIPTION OF THE PRESENTLY PREFERRED EMBODIMENT

Figure 1:
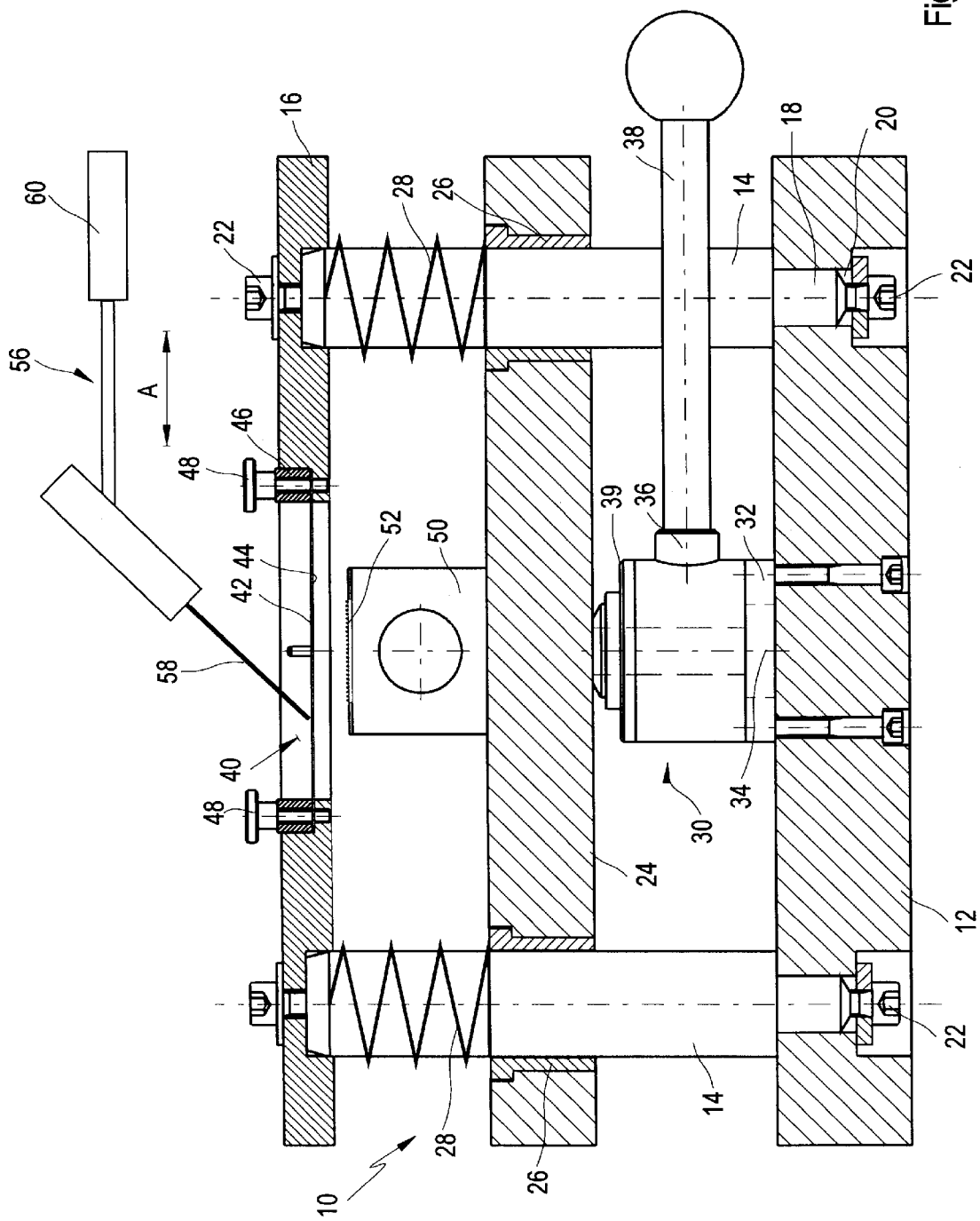
FIG. 1 is a schematic partial sectional view through the inventive apparatus in a plane perpendicular to the screens.

The apparatus shown in FIG. 1 comprises a rack, designated in general as 10, with a base plate 12, a plurality of supports 14, of which only two are visible in FIG. 1, and a covering plate 16. The supports 14 are formed from cylindrical bolts, each with a smaller-diameter section 18 at its end, with which they are respectively plugged into a bore 20 in the base plate 12 or of the covering plate 16. The base plate 12 and the covering plate 16 are rigidly connected with the supports 14 by means of screws 22 that are axially screwed into the ends thereof.

On the supports 14, a pressure plate 24 parallel to the base plate 12 or, respectively, to the covering plate 16 is movably guided, whereby the supports 14 go through the pressure plate 24 in guide bushings 26. Screw pressure springs 28, which surround the supports 14, are arranged between the pressure plate 24 and the covering plate 16; these springs press the pressure plate 24 away from the covering plate 16. A positioning element or apparatus, designated in general with 30, is fastened by screws onto the base plate 12, with a setting ring 36 mounted on a base part 32 so as to be rotatable about a vertical axis 34, which ring can be rotated about the axis 34 using a handle 38, and in which there is arranged a piston head 39 that is rotationally rigid with the base part 32 but is axially movable, and can be moved axially during rotation of the setting ring 36 via a steep threading or a screw surface. The piston head 39 lies on the underside of the pressure plate 24, so that this plate can be positioned by rotation of the setting ring 36 (by way of rotation of the handle 38) against the force of the screw pressure springs 28 in the direction of the covering plate 16.

Figure 2:
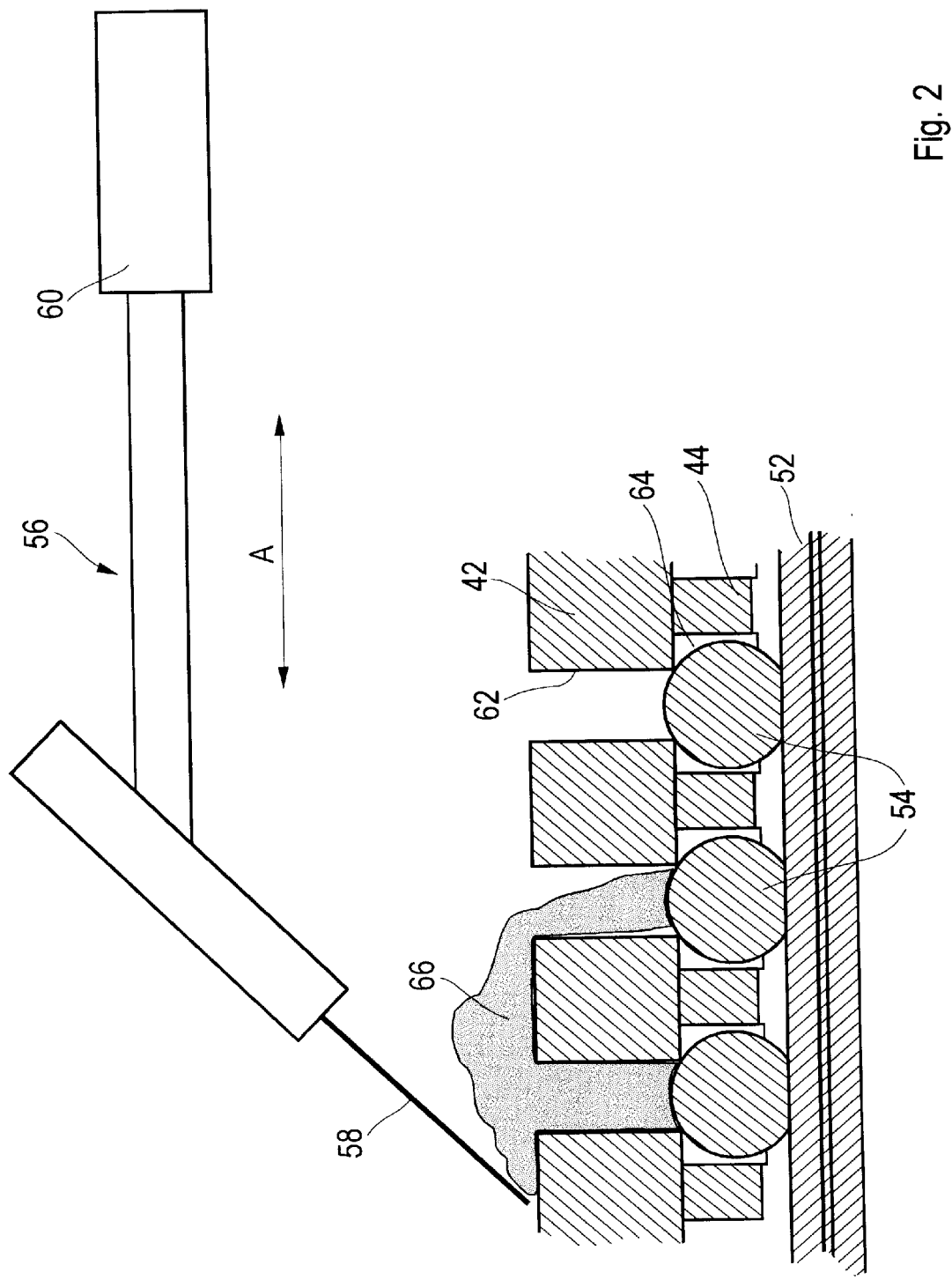
FIG. 2 is an enlarged partial sectional view through the screens and the component.

The covering plate 16 has a large central opening 40 that is covered by two screens parallel to one another, namely a printing screen 42 and an adjusting screen 44 (see also FIG. 2). These are clamped at their edge between the covering plate 16 and a clamp ring or frame 46, using clamping screws 48. The combination of the pressure plate 24 and a block 50 serves as a movable mount for the ball grid array component 52. Specifically, the cubical block 50 is fastened to the upper side of the pressure plate 24, which block forms the actual mount for a ball grid array component 52, whose spherical contact points or contact elements 54 are to be provided with solder paste. The component 54 can thereby for example be fastened to the block 50 using a double-sided adhesive strip.

Above the covering plate 16, there is a doctor blade apparatus, generally designated 56, with a doctor blade 58 that protrudes into the opening 40 of the covering plate 16 and that lies on the printing screen 42, which blade can be moved back and forth in the direction of the double arrow A using a positioning means 60. The doctor blade apparatus 56 is preferably fastened to a frame on which the rack 10 can also be placed.

The manner of operation of the inventive apparatus is now explained in more detail on the basis of FIG. 2.

As can be seen in FIG. 2, the printing screens 42 and the adjusting screens 44 have holes 62 or, respectively, 64 with different diameters, whereby the hole patterns of both screens correspond respectively to the pattern of the contact elements of the component, and the two screens 42 and 44 are placed on one another in such a way that the holes 62 of the pressure screen 42 are axially aligned with the holes 64 of the adjusting screen 44. The diameter of the adjusting holes 64 of the adjusting screen 44 is greater than the diameter of the spherical contact elements 54 of the component 52.

The adjusting of the component 52 relative to the screens 44 and 42 ensues in such a way that for example the rack 10 is first placed on the head, and the component 52 is placed on the adjusting screen 44 in such a way that the spherical contact elements 54 engage in the adjusting holes 64. Subsequently, the pressure plate 24 is moved in the direction toward the covering plate 16 using the positioning mechanism 30, until the block 50 lies against the side of the component 52 turned away from the contact elements 54. This component is then fastened mechanically to the block 50, e.g. using a double-sided adhesive strip. The component 52 is thereby oriented exactly opposite the printing screen 42, as shown in FIG. 2. The rack 10 is now again brought into the output position shown in FIG. 2, and solder paste 66 is applied to the upper side of the printing screen 42, and is spread into the holes 62 of the printing screen 42 using the doctor blade 58. When the holes 62 of the printing screen 42 are filled with solder paste, the same quantity of solder paste is located above each spherical contact element 54. The size of this quantity is determined by the thickness of the printing screen 42 and the diameter of the holes 62. The pressure plate 24 is subsequently lowered to the position shown in FIG. 1 using the positioning element or mechanism 30, whereby the component 52 is drawn exactly perpendicularly away from the screens 44 and 42. In this way, it is ensured that no solder paste is smeared between the spherical pressure elements, which could lead later to shortcircuits between the contact elements.

The above specification shows that with the inventive apparatus it is possible to apply a quantity of solder paste that can be dosed exactly to a large number of contact elements at the same time, even without complicated optical orientation aids and expensive dosage valves.

From the above description, it is apparent that the objects and advantages of the present invention have been achieved. While only certain embodiments have been set forth, alternative embodiments and various modifications will be apparent from the above description to those skilled in the art. For example, the pressure plate or component mount 24 may be raised and lowered using a variety of mechanisms in addition to the positioning element 30 as illustrated in FIG. 1. For example, a hydraulic or motorized lift could be employed. These and other alternatives are considered equivalents and within the spirit and scope of the present invention.

What is claimed:

1. An apparatus for applying solder paste to a plurality of spherical contact elements, the spherical elements being of a first diameter, the apparatus comprising:

a printing screen overlying an adjusting screen, both the printing screen and the adjusting screen comprising a plurality of holes that are in matching registry, the holes of the printing screen having a second diameter that is smaller than the first diameter, the holes of the adjusting screen having a third diameter that is larger than the first and second diameters so that one of the spherical contact elements is accommodated in one of the holes of the adjusting screen but below one of the holes of the printing screen, a component mount to which the spherical contact elements are detachably connected, the component mount being movable to a print position whereby the spherical contact elements are accommodated inside the holes of the adjusting screen and below the holes of the printing screen, a doctor blade disposed above the printing screen for pushing solder paste through the holes of the printing screen and onto the spherical contact elements disposed in the holes of the adjusting screen when the component mount and the spherical contact elements are in the print position, and a cover plate disposed above the component mount with a spring disposed therebetween, the spring biasing the component mount towards a downward position away from the screens and a positioning element engages an underside of the component mount to push the component mount towards the screens.

2. The apparatus according to claim 1 wherein the component mount is movable into a component exchange position whereby the component mount and the spherical contact elements are disposed below the adjusting screen so that the spherical contact elements can be removed from the component mount.

3. The apparatus according to claim 1 further comprising a positioning element supported by a base structure, the positioning element being disposed opposite the component mount from the spherical contact elements, the positioning element engaging the component mount and moving the component mount into the print position and holds the component mount in said print position.

4. The apparatus according to claim 1 wherein the doctor blade is coupled with a drive apparatus.

5. The apparatus according to claim 1 wherein said cover plate disposed above the component mount defines an open area across which the printing and adjusting screens are suspended, the cover plate being detachably connected to the printing and adjusting screens, the apparatus further comprising a base plate disposed below the component mount and a plurality of supports that extend through the component mount and connect the base plate to the cover plate.

6. The apparatus according to claim 1 wherein the component mount comprises a pressure plate that is oriented parallel to the screens and that is movable towards and away from the screens by said positioning element.

7. An apparatus for applying solder paste to spherical contact elements of a component, the spherical contact elements being of a consistent diameter, the apparatus comprising:

a rack comprising a cover plate disposed above a pressure plate disposed above a base plate, the cover, pressure and base plates being connected by a plurality of vertical supports that are connected to the cover and base plates but which pass through the pressure plate thereby permitting the pressure plate to slide towards and away from the cover plate by a positioning element, the cover plate defining an open middle area and supporting a printing screen and an adjusting screen across the open area, the printing screen overlying the adjusting screen, both the printing screen and the adjusting screen comprising a plurality of holes that are in matching registry, the holes of the printing screen having a first mesh size that is smaller than the diameter of the spherical contact element, the holes of the adjusting screen having a second mesh size that is larger than the diameter of the spherical contact elements and the first mesh size of the printing screen so that one of the spherical contact elements is accommodated in one of the holes of the adjusting screen and below one of the holes of the printing screen, the pressure plate having an upper surface which accommodates a support to which the component is detachably connected, the pressure plate being movable between a print position whereby the spherical contact elements are accommodated inside the holes of the adjusting screen and below the holes of the printing screen and a component exchange position whereby the support and component are disposed below the adjusting screen so that the component can be removed from the support, the positioning element comprising a piston that engages an underside of the pressure plate and that moves axially upward to move the pressure plate into the print position and axially downward to move the pressure plate into the component exchange position, and the apparatus further comprising a doctor blade disposed above the printing screen for pushing solder paste through the holes of the printing screen and onto the spherical contact elements disposed in the holes of the adjusting screen when the component mount and the spherical contact elements are in the print position.

8. The apparatus according to claim 7 wherein the pressure plate is spring biased towards the component exchange position.

9. The apparatus according to claim 7 wherein the doctor blade is coupled with a drive apparatus.

10. An apparatus for applying solder paste to a plurality of spherical contact elements, the spherical elements being of a first diameter, the apparatus comprising:

a printing screen overlying an adjusting screen, both the printing screen and the adjusting screen comprising a plurality of holes that are in matching registry, the holes of the printing screen having a second diameter that is smaller than the first diameter, the holes of the adjusting screen having a third diameter that is larger than the first and second diameters so that one of the spherical contact elements is accommodated in one of the holes of the adjusting screen but below one of the holes of the printing screen, a component mount to which the spherical contact elements are detachably connected, the component mount being movable to a print position whereby the spherical contact elements are accommodated inside the holes of the adjusting screen and below the holes of the printing screen, a doctor blade disposed above the printing screen for pushing solder paste through the holes of the printing screen and onto the spherical contact elements disposed in the holes of the adjusting screen when the component mount and the spherical contact elements are in the print position, a cover plate disposed above the component mount which defines an open area across which the printing and adjusting screens are suspended, the cover plate being detachably connected to the printing and adjusting screens, the apparatus further comprising a base plate disposed below the component mount and a plurality of supports that extend through the component mount and connect the base plate to the cover plate.

11. The apparatus according to claim 10 wherein the component mount is movable into a component exchange position whereby the component mount and the spherical contact elements are disposed below the adjusting screen so that the spherical contact elements can be removed from the component mount.

12. The apparatus according to claim 10 further comprising a positioning element supported by a base structure, the positioning element being disposed opposite the component mount from the spherical contact elements, the positioning element engaging the component mount and moving the component mount into the print position and holds the component mount in said print position.

13. The apparatus according to claim 10 wherein the doctor blade is coupled with a drive apparatus.

14. The apparatus according to claim 10 wherein the component mount comprises a pressure plate that is oriented parallel to the screens and that is movable towards and away from the screens by a positioning element.

15. The apparatus according to claim 10 further comprising a cover plate disposed above the component mount with a spring disposed therebetween, the spring biasing the component mount towards a downward position away from the screens and a positioning element engages an underside of the component mount to push the component mount towards the screens.

16. An apparatus for applying solder paste to spherical contact elements of a component, the spherical contact elements being of a first diameter, the apparatus comprising:

a rack for supporting a printing screen and an adjusting screen across an open area, the printing screen overlying the adjusting screen, both the printing screen and the adjusting screen comprising a plurality of holes that are in matching registry, the holes of the printing screen having a second diameter that is smaller than the first diameter, the holes of the adjusting screen having a third diameter that is larger than the first and second diameters so that one of the spherical contact elements is accommodated in one of the holes of the adjusting screen and below one of the holes of the printing screen, the rack further comprising a component mount to which the component is detachably connected, the component mount being movable between a print position whereby the spherical contact elements are accommodated inside the holes of the adjusting screen and below the holes of the printing screen and a component exchange position whereby the component mount and spherical contact elements are disposed below the adjusting screen so that the component can be removed from the component mount, the rack further comprising a positioning element that moves the component mount into the print position and holds the component mount in said print position, and the rack further comprises a cover plate disposed above the component mount which defines the open area and which is connected to the printing and adjusting screens, the rack further comprising a base plate disposed below the component mount and a plurality of supports that extend through the component mount and connect the base plate to the cover plate, the apparatus further comprising a doctor blade disposed above the printing screen for pushing solder paste through the holes of the printing screen and onto the spherical contact elements disposed in the holes of the adjustment screen when the component mount and the spherical contact elements are in the print position.

17. The apparatus according to claim 16 wherein the printing and adjusting screens are detachably connected to the rack.

18. The apparatus according to claim 16 wherein the component mount comprises a pressure plate that is oriented parallel to the screens and that is movable towards and away from the screens by the positioning element.

19. The apparatus according to claim 16 further comprising a cover plate disposed above the component mount with a spring disposed therebetween, the spring biasing the component mount towards a downward position away from the screens and the positioning element engages an underside of the component mount to push the component mount towards the screens.

20. The apparatus according to claim 16 wherein the doctor blade is coupled with a drive apparatus.

* * * * *